(12) United States Patent
Yap et al.

(10) Patent No.: US 9,831,304 B1
(45) Date of Patent: Nov. 28, 2017

(54) INTEGRATED CIRCUITS WITH DEEP TRENCH ISOLATIONS AND METHODS FOR PRODUCING THE SAME

(71) Applicant: Globalfoundries Singapore Pte. Ltd., Singapore (SG)

(72) Inventors: Mun Tat Yap, Singapore (SG); Shiang Yang Ong, Singapore (SG); Namchil Mun, Singapore (SG); Tat Wei Chua, Singapore (SG); Raj Verma Purakh, Singapore (SG); Jeoung Mo Koo, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/271,599

(22) Filed: Sep. 21, 2016

(51) Int. Cl.
| | |
|---|---|
| *H01L 29/06* | (2006.01) |
| *H01L 21/66* | (2006.01) |
| *H01L 23/535* | (2006.01) |
| *H01L 21/768* | (2006.01) |
| *H01L 21/762* | (2006.01) |
| *H01L 27/02* | (2006.01) |

(52) U.S. Cl.
CPC .... *H01L 29/0623* (2013.01); *H01L 21/76224* (2013.01); *H01L 21/76895* (2013.01); *H01L 22/12* (2013.01); *H01L 23/535* (2013.01); *H01L 27/0207* (2013.01); *H01L 29/0649* (2013.01)

(58) Field of Classification Search
CPC . H01L 29/0623; H01L 22/12; H01L 27/0207; H01L 21/76895; H01L 21/76224; H01L 23/535
See application file for complete search history.

(56) References Cited

U.S. PATENT DOCUMENTS

| | | | |
|---|---|---|---|
| 6,420,749 B1 * | 7/2002 | Divakaruni | ........... H01L 21/743 257/301 |
| 8,395,217 B1 * | 3/2013 | Cheng | ..................... H01L 21/84 257/350 |
| 9,147,692 B2 | 9/2015 | Yang | |
| 2010/0140698 A1 * | 6/2010 | Roig-Guitart | ....... H01L 29/0634 257/335 |

* cited by examiner

*Primary Examiner* — David Vu
(74) *Attorney, Agent, or Firm* — Lorenz & Kopf, LLP

(57) ABSTRACT

Integrated circuits and methods of producing such integrated circuits are provided. In an exemplary embodiment, a method of producing an integrated circuit includes determining a guard ring width within an integrated circuit design layout, where a guard ring with the guard ring width surrounds an active area in the integrated circuit design layout. A deep trench location is calculated for replacing the guard ring, where the deep trench location depends on the guard ring width. The guard ring in the integrated circuit design layout is replaced with a deep trench having the deep trench location. The deep trench is formed within a substrate at the deep trench location, where the deep trench surrounds the active area.

18 Claims, 7 Drawing Sheets

INTEGRATED CIRCUITS WITH DEEP TRENCH ISOLATIONS AND METHODS FOR PRODUCING THE SAME

TECHNICAL FIELD

The technical field generally relates to integrated circuits having integrated circuit design layouts with deep trench isolations and methods of producing the same, and more particularly relates to integrated circuit design layouts with deep trench isolations that may replace all guard rings and methods of producing the same.

BACKGROUND

Many integrated circuits are formed within active areas of a substrate, and structures within an integrated circuit design layout may help electrically isolate one active area from a neighboring active area so that electronic components in different active areas do not undesirably influence each other. Different types of structures can be used for this isolation, such as a guard ring or a deep trench. A guard ring has conductivity determining impurities implanted into the substrate, where the guard ring surrounds an active area that may include a well. Electronic components are formed in the active area, so electrical isolation of different active areas in the substrate also isolates the electronic components in those different active areas. Grounded contacts may be in electrical communication with the guard ring to facilitate the isolation. The guard rings may have varying widths for different degrees of isolation or to better fit the space within the integrated circuit design layout, where the circuit design may include multiple guard rings of varying size and shape in different locations. Different types of guard rings may be used for N and for P type wells, such as a P guard ring for an N type well and an N guard ring for a P type well. Integrated circuit design layouts are often provided with guard rings in place.

Production techniques that reduce cost are desirable for integrated circuits in part because of significant price pressure, but also because reduced cost is always desirable. Royalties for intellectual property owned by others can contribute to the cost of integrated circuits, where the use of different patented processes can increase the number of required royalties and thereby increase the total cost. Furthermore, process changes from one type of structure to another for different circuits or for similar purposes within an integrated circuit can also increase costs, in part because different structures may require an increase in the total number of manufacturing steps. For example, different process steps may be required for a deep well and for a guard ring, so including both types of isolation structures in an integrated circuit design layout requires additional manufacturing steps because each structure may be separately formed with different steps. Equipment changes may be required between runs of different types of integrated circuits to accommodate the different manufacturing tools used to form deep wells versus the manufacturing tools used to form guard rings. These equipment changes between runs increase the set up costs when a manufacturing facility changes from one type of integrated circuit to another where the two different types of integrated circuits include different types of electrical isolation structures.

Accordingly, it is desirable to provide integrated circuit design layouts with a uniform type of isolation structure throughout the integrated circuit design layout, and methods of producing the same. In addition, it is desirable to provide methods and structures for modifying integrated circuit design layout to change one designed isolation structure into the uniform type of isolation structure, so the same type of isolation structure may be used for different types of integrated circuit design layouts. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods of producing such integrated circuits are provided. In an exemplary embodiment, a method of producing an integrated circuit includes determining a guard ring width within an integrated circuit design layout, where a guard ring with the guard ring width surrounds an active area in the integrated circuit design layout. A deep trench location is calculated for replacing the guard ring, where the deep trench location depends on the guard ring width. The guard ring in the integrated circuit design layout is replaced with a deep trench having the deep trench location. The deep trench is formed within a substrate at the deep trench location, where the deep trench surrounds the active area.

An integrated circuit is provided in another embodiment. The integrated circuit includes a substrate and a plurality of active areas within the substrate. A deep trench is positioned within the substrate, where the deep trench forms a double ring with a deep trench center branch that forms a part of each of the two rings. The double ring also includes two deep trench end branches, and each one of the two rings includes one of the two deep trench end branches. The two deep trench end branches are about parallel with the deep trench center branch. The deep trench center branch has a deep trench center branch length and the two deep trench end branches have a deep trench end branch length, where the deep trench end branch length is the same for each of the two deep trench end branches. The deep trench center branch length is greater than the deep trench end branch length. One of the plurality of active areas is within each ring of the double ring.

An integrated circuit is provided in yet another embodiment. The integrated circuit includes a substrate and a plurality of active areas within the substrate. A deep trench is positioned within the substrate, where the deep trench forms a triple ring with a center ring between two end rings. One of the plurality of active areas is within each end ring, and the substrate within the center ring is free of the plurality of active areas.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and process steps described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details.

Figure 1:
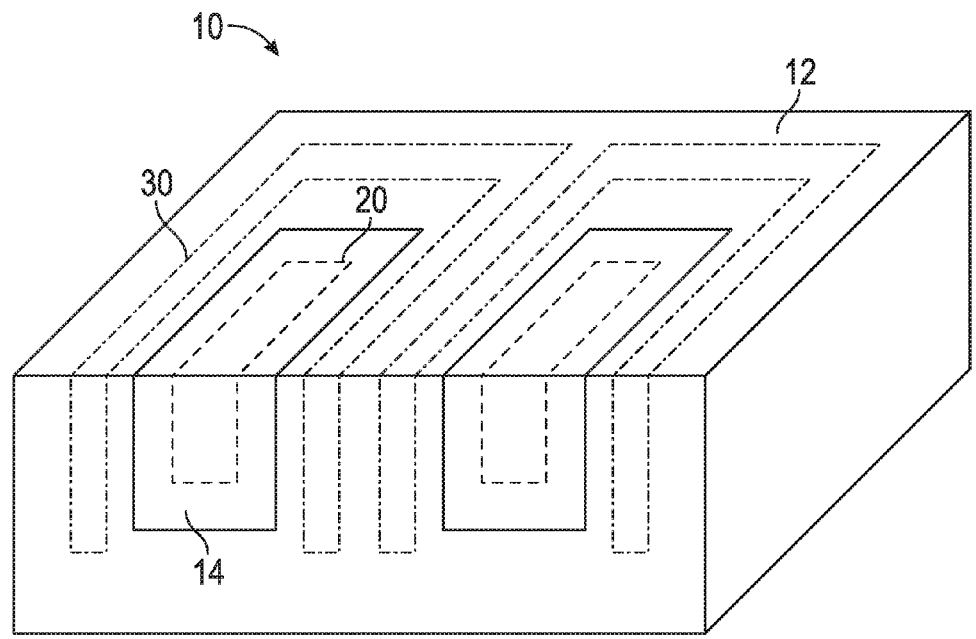
FIG. 1 is a cutaway perspective view of one embodiment of an integrated circuit design layout.

Integrated circuit design layouts that include guard rings may be modified to replace the guard rings with a deep trench having essentially uniform dimensions throughout the integrated circuit design layout. Reference is made to a portion of an integrated circuit design illustrated in FIG. 1. FIG. 1 illustrates an integrated circuit design layout 10 with two active areas 20 that are surrounded by guard rings 30. The integrated circuit design layout 10 as designed includes a substrate 12 including semiconductor material. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. As referred to herein, a material that includes a recited element/compound includes the recited element/compound in an amount of at least 10 weight percent or more based on the total weight of the material unless otherwise indicated. In many embodiments, the substrate 12 primarily includes a monocrystalline semiconductor material. The substrate 12 may be a bulk silicon wafer (as illustrated) or may be a thin layer of silicon on an insulating layer (commonly known as silicon-on-insulator or SOI, not illustrated) that, in turn, is supported by a carrier wafer.

The integrated circuit design layout 10 includes a deep well 14 within the substrate 12, wherein the deep well 14 includes conductivity determining impurities at a concentration of from about $1 \times 10^{16}$ to about $1 \times 10^{19}$ per cubic centimeter in an exemplary embodiment. The deep well 14 may include conductivity determining impurities at a concentration of from about $1 \times 10^{13}$ to about $1 \times 10^{21}$, or from about $1 \times 10^{14}$ to about $1 \times 10^{20}$ in alternate embodiments. The deep well 14 may include "N" type or "P" type conductivity determining impurities at the concentrations listed above in alternate embodiments, so the deep well 14 may be a deep N well or a deep P well in different embodiments. "N" type conductivity determining impurities include arsenic or phosphorous, but antimony, other materials, or combinations thereof can also be used, and different components may be implanted with the same or different "N" type conductivity determining impurities in various embodiments. "P" type conductivity determining impurities include boron, aluminum, gallium, and indium, but other materials or combinations of materials can also be used, and different components may be implanted with the same or different "P" type conductivity determining impurities in various embodiments.

One or more active areas 20 are defined within the deep well 14, where the active area 20 is a portion of the substrate 12 where electronic components (not illustrated) will be produced for a circuit. The active area(s) 20 may be entirely within the deep well 14 and occupy a smaller space than that of the deep well 14, or the active area(s) 20 may occupy a space about the same as that of the deep well 14, or the active area(s) 20 may extend beyond the deep well 14, or the active area(s) 20 may be defined within the substrate 12 in areas that do not include a deep well 14 in yet other embodiments.

A guard ring 30 is defined within the substrate 12 of the integrated circuit design layout 10, where the guard ring 30 surrounds the active area 20. Reference to the guard ring 30 "surrounding" the active area 20 refers to a top view at a surface of the substrate 12, where the guard ring 30 forms a complete line around the active area 20 in 2 dimensions as seen from the top. FIG. 1 is a sectioned view, so a portion of the active area 20 and the guard ring 30 are not illustrated such that FIG. 1 does not show the guard ring 30 completely surrounding the active area 20 because of the portion of the substrate 12 that has been removed from the view. Reference to the guard ring 30 "surrounding" the active area 20 does not mean the guard ring 30 forms a complete 3 dimensional enclosure around the active area 20, and in many embodiments the space above and below the active area 20 is free of the guard ring 30. As such, electrical connections may be formed to electronic components from above or below the active area 20 without passing directly through the guard ring 30. It is understood that the integrated circuit design layout 10 may be moved such that the relative "up" and "down" positions change, so reference to "up" or "down" is relative to a plane at the surface of the substrate 12. The guard ring 30 is a design feature of the integrated circuit design layout 10, as opposed to an actual structure built into the integrated circuit, where the integrated circuit design layout 10 is changed to replace the guard ring 30 with a deep trench (illustrated below in FIG. 2) before actual manufacture of the integrated circuit, as described below. The designed guard ring 30, if produced, would be a portion of the substrate 12 with conductivity determining impurities at a concentration of from about $1 \times 10^{16}$ to about $1 \times 10^{21}$ per cubic centimeter in an exemplary embodiment, or from about $1 \times 10^{16}$ to about $1 \times 10^{20}$, or from about $1 \times 10^{16}$ to about $1 \times 10^{19}$ in alternate embodiments, where the conductivity determining impurities may be "N" or "P" type.

Figure 2:
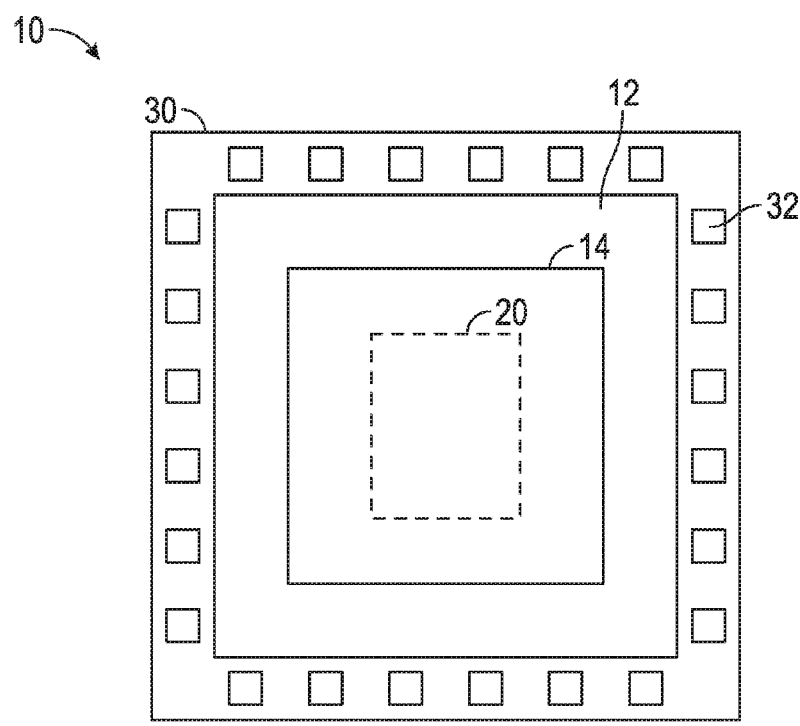
FIG. 2 is a top view of a portion of an exemplary integrated circuit design layout.
Figure 3:
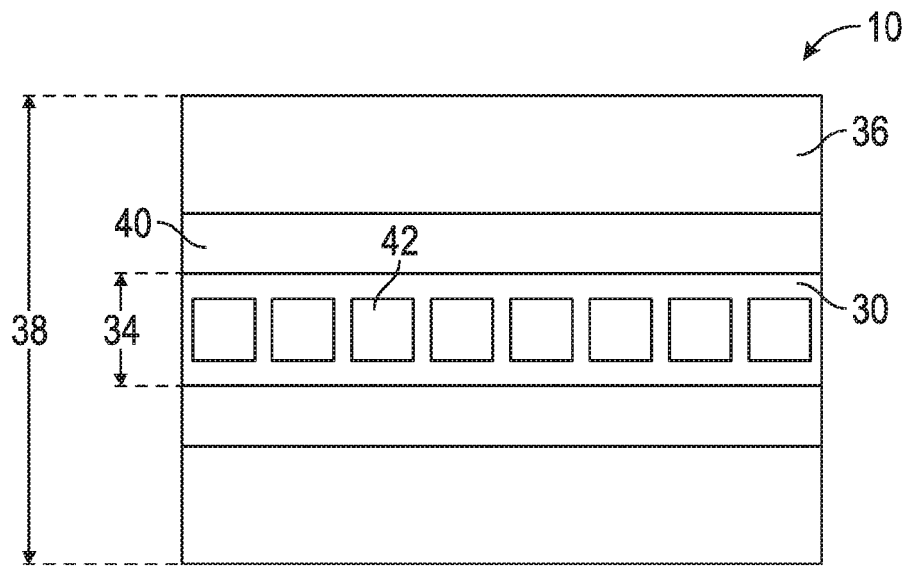
FIG. 3 is a top view illustrating a location for a guard ring in the integrated circuit design layout and a deep trench to replace the guard ring.

Referring to FIG. 2, a portion of the integrated circuit design layout 10 includes a designed guard ring 30 that surrounds a deep well 14 and an active area 20, where FIG. 2 is a top view. The designed guard ring 30 includes a plurality of guard ring contact points 32 that may be used to electrically ground the guard ring 30. A portion of the guard ring 30 without any guard ring contact points 32 is illustrated in FIG. 3. A design change for the integrated circuit design layout 10 includes eliminating the guard ring 30 and replacing it with a deep trench, as described below. The guard ring 30 has a guard ring width 34, and a deep trench 36 has a deep trench location that is based on a location of the guard ring 30 and the guard ring width 34. The deep trench 36 has a set deep trench width 38, where every deep trench 36 formed within the integrated circuit design layout 10 as a replacement for a guard ring 30 may have the same set deep trench width 38. The guard ring width 34 may vary significantly throughout the integrate circuit design layout 10. The set deep trench width 38 may be from about 1 to about 3 microns in an exemplary embodiment, but the set deep trench width 38 may be from about 0.5 to about 5 microns, or from about 0.3 to about 10 microns, in alternate embodiments. The deep trench 36 may also have a set deep trench depth (not currently illustrated), and every deep trench 36 may have the same set deep trench depth such that the deep trenches 36 are substantially uniform in dimensions within the integrated circuit design layout 10. The set deep trench depth may be from about 10 to about 100 microns in an exemplary embodiment, but the set deep trench depth may also be from about 10 to about 200 microns or about 10 to about 300 microns in alternate embodiments.

Figure 4:
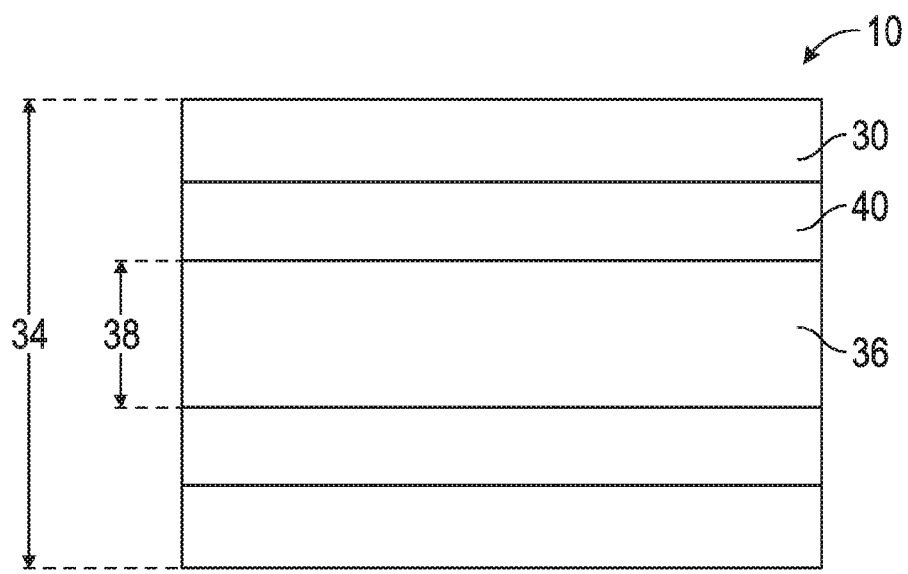
FIG. 4 is a top view of an alternate embodiment of a location for a guard ring and a deep trench to replace the guard ring.

Various mathematical operations may be used to determine the location of the deep trench 36, and the mathematical operations may be automated such that a computer program can determine the location of the deep trenches 36 based on the location of the guard rings 30 and the guard ring widths 34 in the integrated circuit design layout 10. In an exemplary embodiment illustrated in FIG. 3, the guard ring width 34 is less than the set deep trench width 38. In some embodiments, a fill region 40 is mathematically added to sides of the guard ring 30, and a plurality of fill polygons 42 are formed at the center of the fill region 40. The deep trench 36 is added to the fill region 40 to determine the location of the deep trench 36, where the fill polygons 42 are located at the center of the deep trench 36. In an embodiment where the guard ring width 34 is from about 1 times the set deep trench width 38 to about 3.5 times the set deep trench width 38, the fill region 40 is formed within the guard ring width 34, as illustrated in FIG. 4. The deep trench 36 with the set deep trench width 38 is then formed at the center of the fill region 40. Alternate mathematical operations or strategies may be employed in alternate embodiments.

Figure 5:
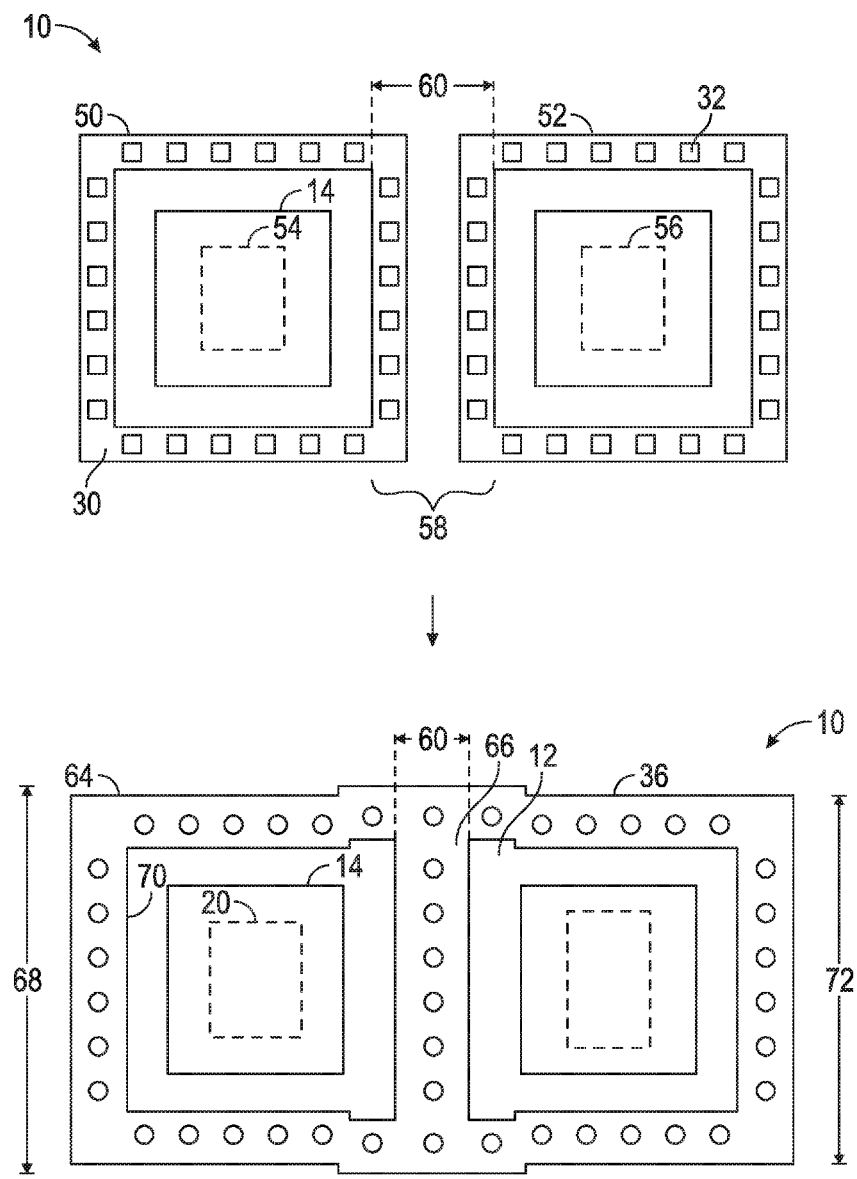
FIG. 5 is a top view of an embodiment for replacing a guard ring with a deep trench around two active areas.

Several design challenges may be encountered when designing deep trenches 36 to replace guard rings 30 in an actual integrated circuit design layout 10. One such design challenge may be referred to as a proximity challenge, as illustrated in FIG. 5 with continuing reference to FIGS. 3 and 4. The guard ring 30 in FIG. 5 includes a first guard ring 50 and a second guard ring 52 that surround a first active area 54 and a second active area 56, respectively. A double center guard ring branch 58 includes the straight portions of the first and second guard rings 50, 52 that are at least partially positioned between the first and second active areas 54, 56. The double center guard ring branch 58 has a double branch width 60 measured from the edges of the double center guard ring branch 58 that are furthest from each other. In other words, the double branch width 60 is measured from the edges of the double center guard ring branch 58 that are closest to the first and second active areas 54, 56, respectively.

If the double branch width 60 is from between about 2 times the set deep trench width 38 to about 2.5 times the set deep trench width 38 there may not be space for two deep trenches 36 to replace the double center guard ring branch 58. Therefore, the basic calculation for replacing the guard ring 30 with the deep trench 36 described above may not be effective. As such, a single section of the deep trench 36 is formed to replace the two portions of the double center guard ring branch 58. As such, the deep trench 36 forms a double ring 64, similar to a FIG. 8, where one ring of the double ring 64 surrounds the first active area 54 and the other ring of the double ring 64 surrounds the second active area 56. The double ring 64 has a deep trench center branch 66 with a deep trench center branch length 68, where the one deep trench center branch 66 replaces the two portions of the double center guard ring branch 58. As such, the deep trench center branch 66 forms a part of each of the two rings of the double ring 64. The double ring 64 also has two deep trench end branches 70 that are about parallel with the deep trench center branch 66, where the deep trench end branches 70 have the same deep trench end branch length 72. Each one of the two rings includes one of the two deep trench end branches 70. The deep trench center branch length 68 is greater than the deep trench end branch length 72, so the FIG. 8 shape appears extended in the middle. The double ring 64 described above may be connected to other deep trenches 36 such that the double ring 64 is only one piece of a labyrinth formed by deep trenches 36, so the double ring 64 may not be a standalone structure. As can be seen, the portion of the double ring 64 that connects the deep trench center branch 66 and the deep trench end branches 70 is not straight and has a jog or bend for the different lengths.

Figure 6:
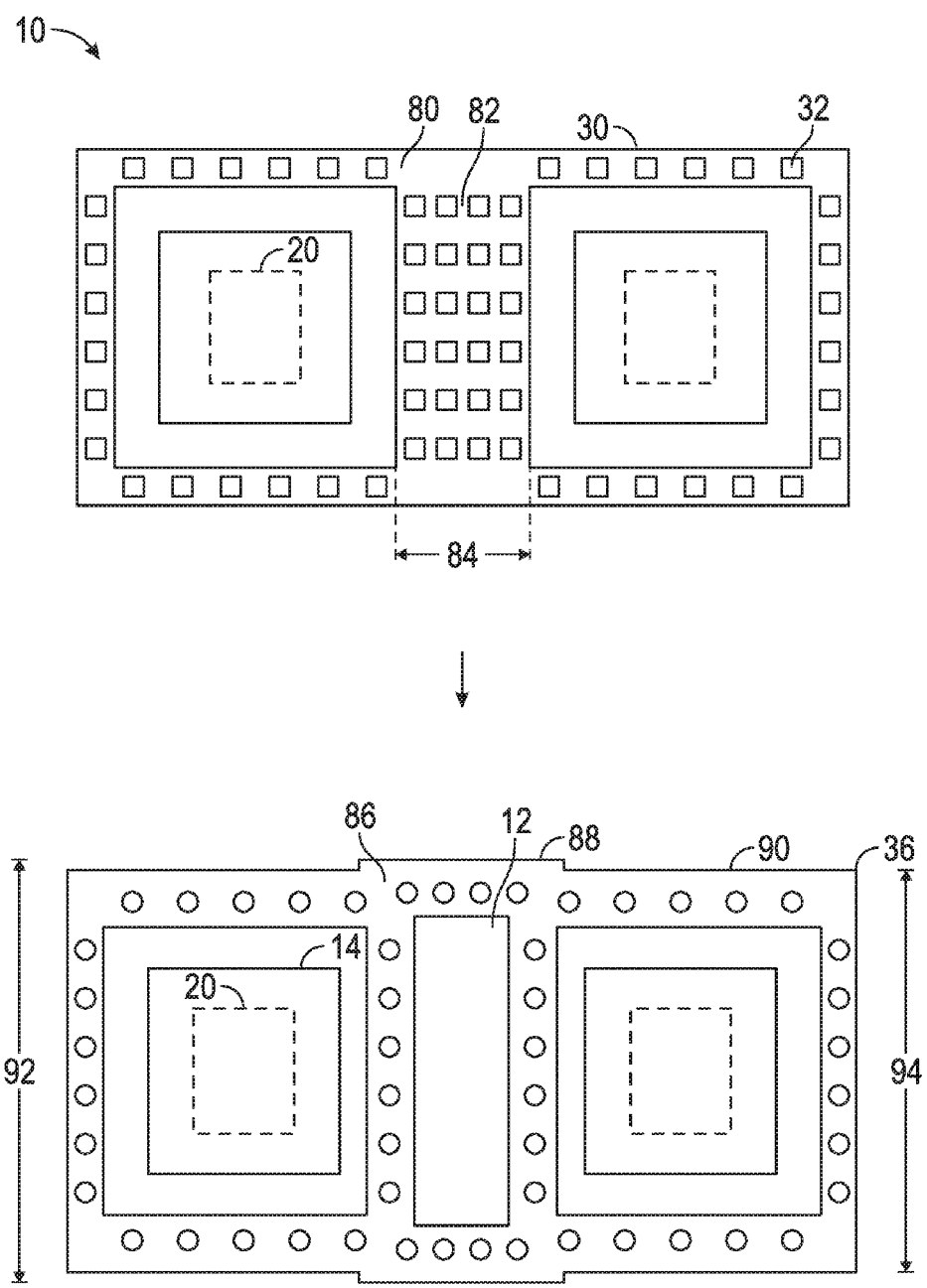
FIG. 6 is a top view of an alternate embodiment for replacing a guard ring with a deep trench around two active areas.

Another possible challenge is a wide guard ring 30 having a width that is about 3.5 times or more than the set deep trench width 38, as illustrated in an exemplary embodiment in FIG. 6. If the guard ring 30 is too wide, the distance between a single centrally located deep trench 36 and the active area 20 would be increased and the device performance within the active area 20 may be impaired. One possible reason for a wide guard ring 30 is when the integrated circuit design layout 10 includes a plurality of active areas 20 such that the guard ring 30 forms a guard double ring 80 where each ring of the guard double ring 80 surrounds one or more of a plurality of active areas 20. The guard double ring 80 includes a guard center branch 82 with a guard center branch width 84 that is about 3.5 times or more greater than the set deep trench width 38. The designed guard ring 30 is replaced with the deep trench 36, where the deep trench forms a triple ring 86 having a center ring 88 and two end rings 90. The center ring 88 may have a center ring length 92 that is greater than an end ring length 94 of the two end rings 96, as illustrated. Each of the two end rings 96 may have the same end ring length 94, and each of the two end rings 96 surrounds one or more of the plurality of active areas 20. The center ring 88 may be free of an active area 20, so the center ring 88 may surround a portion of the substrate 12 that does not include an active area 20.

The design changes described above illustrate embodiments for determining a deep trench location based on a guard ring 30 and a guard ring width 34, where all of the replacement deep trenches 36 within the integrated circuit design layout 10 may have the same set deep trench width 38 and/or the same set deep trench depth. As mentioned above, the designed guard ring width 34 may vary significantly throughout the integrated circuit design layout 10, so the replacement deep trenches 36 may have a smaller footprint, about the same footprint, or a larger footprint than the guard rings 30 in different parts of the integrated circuit design layout 10. The consistent dimensions of the deep trenches 36 can reduce design challenges and costs associated with the use of different types and/or sizes of isolation components. The integrated circuit design layout 10 is produced after the design changes are made, as described below.

Figure 7:
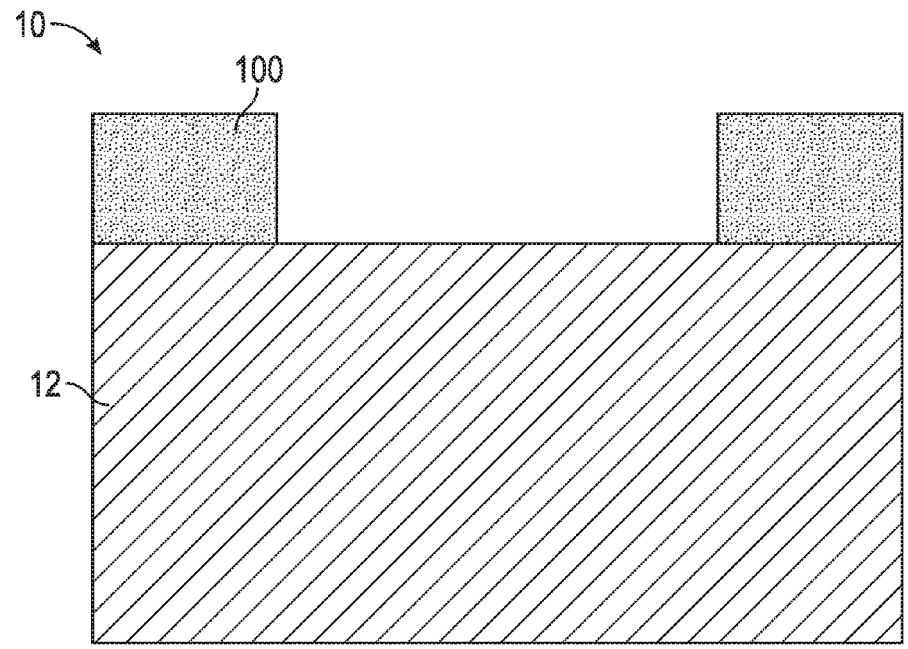
FIGS. 7-11 illustrate, in cross sectional views, an integrated circuit design layout and methods for fabricating the same in accordance with exemplary embodiments.

In an exemplary embodiment illustrated in FIG. 7, a deep trench photoresist 100 is formed and patterned over the substrate 12. The deep trench photoresist 100 (and other photoresist layers described below) may be deposited by spin coating, and patterned by exposure to light or other electromagnetic radiation through a mask with transparent sections and opaque sections. The light causes a chemical change in the photoresist such that either the exposed portion or the non-exposed portion can be selectively removed. The desired locations may be removed with an organic solvent, and the deep trench photoresist 100 remains overlying the other areas of the substrate 12. The deep trench photoresist 100 (and other photoresist layers described below) may optionally include a top and/or bottom anti-reflective coating and/or a hard mask (not illustrated). Many anti-reflective coatings are available, including inorganic and organic compounds, such as titanium nitride or organosiloxanes. Titanium nitride may be deposited by chemical vapor deposition using tetramethylamidotitanium and nitrogen trifluoride, and organosiloxanes may be deposited by spin coating. Anti-reflective coatings may improve the accuracy and critical dimensions during photoresist patterning. Silicon nitride may be used as a hard mask, where silicon nitride can be formed by low pressure chemical vapor deposition using ammonia and dichlorosilane.

Figure 8:
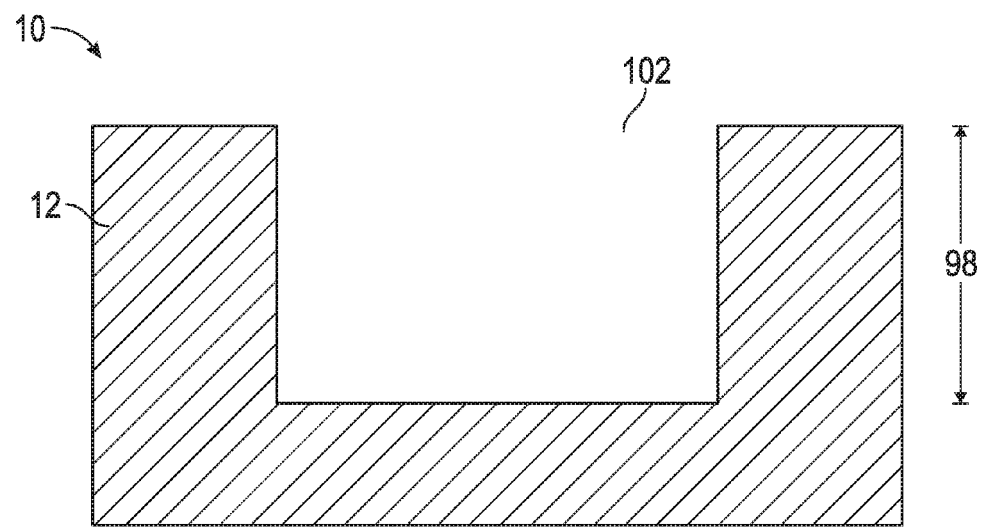

The substrate 12 may be anisotropically etched to produce a valley 102 using the deep trench photoresist 100 or an associated hard mask (not illustrated), as seen in FIG. 8 with continuing reference to FIG. 7. The valley 102 may have a set deep trench depth 98 that extends from the surface of the substrate 12 to the bottom of the valley 102, where the set deep trench depth 98 is discussed above. A monocrystalline substrate may be anisotropically etched with a reactive ion etch using carbon tetrafluoride, but many other etchants or etch techniques may also be used. A deep trench insulator layer 104 is formed within the valley 102, as illustrated in an exemplary embodiment in FIG. 9. The deep trench insulator layer 104 may be formed by thermal oxidation of the substrate 12, but the deep trench insulator layer 104 may be deposited in alternate embodiments. The deep trench insulator layer 104 is formed from an electrically insulating material, such as silicon dioxide, but other electrically insulating materials may be used in alternate embodiments. As used herein, an "electrically insulating material" is a material with a resistivity of about $1 \times 10^4$ ohm meters or more, and an "electrically conductive material" is a material with a resistivity of about $1 \times 10^{-4}$ ohm meters or less.

Figure 9:
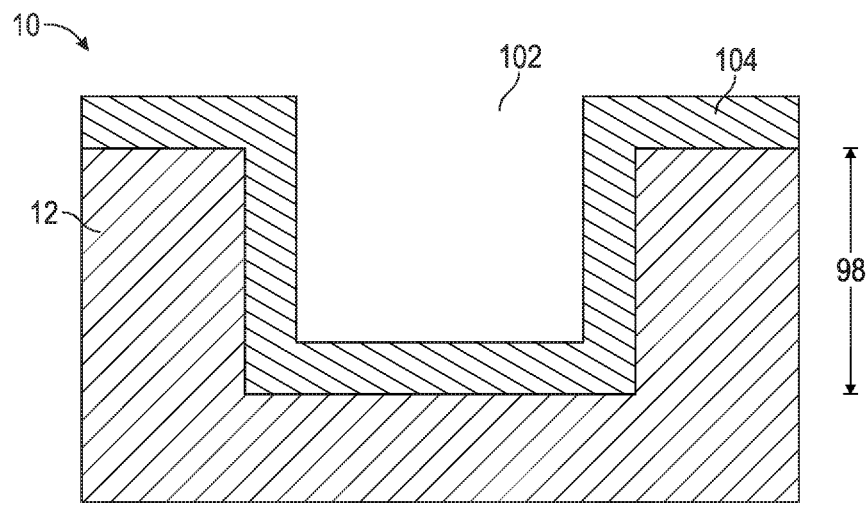
Figure 10:
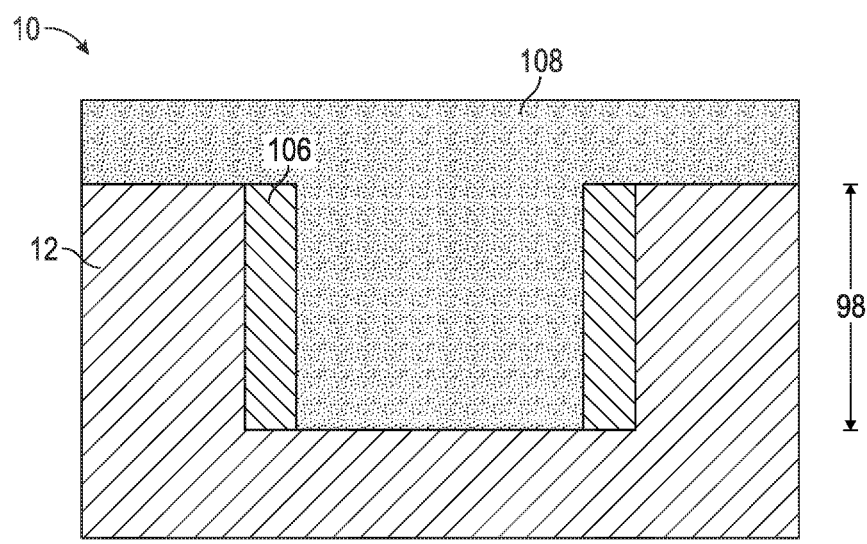

Reference is made to FIG. 10, with continuing reference to FIG. 9. Deep trench spacers 106 are formed within the valley 102 with an anisotropic etch of the deep trench insulator layer 104, where the anisotropic etch removes the horizontal portions of the deep trench insulator layer 104 more rapidly than the vertical portions that form the deep trench spacers 106. In an embodiment where the deep trench insulator layer 104 includes silicon dioxide, the anisotropic etch may be a reactive ion etch using carbon tetrachloride, but a wide variety of etchants or etch techniques may be used in alternate embodiments. A core layer 108 is formed overlying the substrate 12 at the bottom of the valley 102, where the core layer 108 includes an electrically conductive material. In an exemplary embodiment, the core layer 108 includes polysilicon with conductivity determining impurities, which may be formed by low pressure chemical vapor deposition in a silane environment. As used herein, the term "overlying" means "over" such that an intervening layer may lie between the core layer 108 and the substrate 12, or "on" such that the core layer 108 physically contacts the substrate 12. The core layer 108 is in electrical communication with the substrate 12 at the bottom of the valley 102. The term "electrical communication," as used herein, means electrical current is capable of flowing from one component to another, where the electrical current may or may not flow through an electrically conductive intervening component.

Figure 11:
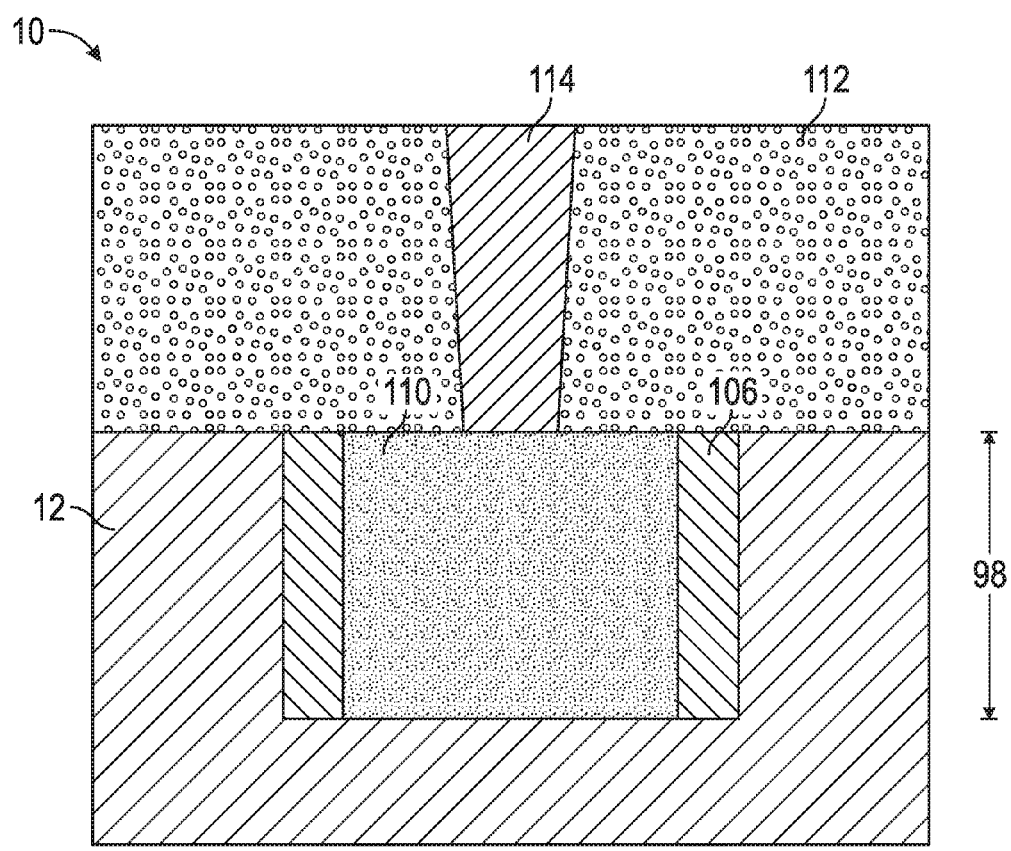

Referring to an exemplary embodiment in FIG. 11, with continuing reference to FIG. 10, a deep trench core 110 is formed by removing the overburden portions of the core layer 108 that overlie the deep trench spacers 106, such as with chemical mechanical planarization. The deep trench 36 includes the deep trench core 110 and the two deep trench spacers 106, so formation of the deep trench 36 may be completed with the formation of the deep trench core 110. The deep trench core 110 remains in electrical communication with the substrate 12, such as at a bottom of the deep trench core 110. An interlayer dielectric 112 may be formed overlying the deep trench 36 and the substrate 12, such as by chemical vapor deposition of silicon dioxide or other electrically insulating materials. Silicon dioxide can be formed by chemical vapor deposition using silane and oxygen, but other materials or techniques may be used in alternate embodiments. One or more deep trench contacts 114 may be formed in electrical communication with the deep trench core 110, where the deep trench contacts 114 may be electrically grounded to aid in isolating an active area adjacent to the deep trench 36. The deep trench contacts 114 may be formed by etching a via (not individually illustrated) through the interlayer dielectric 112 at the desired location, and filling the via with an electrically conductive material. The via may be positioned with photoresist, as described above.

In an exemplary embodiment, the deep trench contacts 114 include an adhesion layer, a barrier layer, and a plug (not individually illustrated), which may be sequentially deposited. In an exemplary embodiment, an adhesion layer of titanium is formed by low pressure chemical vapor deposition of titanium pentachloride, a barrier layer of titanium nitride is formed by chemical vapor deposition of titanium tetrabromide and ammonia, and a plug of tungsten is formed by chemical vapor deposition of tungsten hexafluoride and hydrogen. Other types of contacts are also possible, such as copper or other conductive materials.

The deep trenches 36 with a constant set deep trench width 38 and/or a constant set deep trench width 38 throughout the integrated circuit design layout 10 may allow for fewer license fees for intellectual property relating to electrical isolation, and may also reduce costs by providing one consistent electrical isolation design for all the active areas 20 within an integrated circuit design layout 10.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of producing an integrated circuit comprising:
   determining a guard ring width within an integrated circuit design layout, wherein a guard ring having the guard ring width surrounds an active area in the integrated circuit design layout;
   determining a guard ring location wherein the guard ring comprises a first guard ring surrounding a first active area and a second guard ring surrounding a second active area, and wherein a double center guard ring branch comprises a straight portion of the first guard ring and a straight portion of the second guard ring positioned between the first active area and the second active area;
   calculating a deep trench location for replacing the guard ring, wherein the deep trench location depends on the guard ring width, wherein calculating the deep trench location comprises calculating the deep trench location to form a double ring comprising two rings, wherein one ring of the double ring surrounds the first active area and the other ring of the double ring surrounds the second active area, wherein the double ring comprises one deep trench center branch between the two rings of the double ring;
   replacing the guard ring in the integrated circuit design layout with a deep trench having the deep trench location; and
   forming the deep trench within a substrate at the deep trench location, wherein the deep trench surrounds the active area.

2. The method of claim 1 wherein forming the deep trench within the substrate comprises forming a deep trench core between two deep trench spacers, wherein the deep trench core is an electrical conductor and the two deep trench spacers are electrical insulators.

3. The method of claim 2 wherein forming the deep trench comprises forming the deep trench core such that the deep trench core is in electrical communication with the substrate.

4. The method of claim 3 further comprising:
   forming a contact in electrical communication with the deep trench core.

5. The method of claim 1 further comprising:
   determining an active area location for the active area, wherein the active area location comprises a deep N well.

6. The method of claim 5 wherein calculating the deep trench location comprises calculating the deep trench location wherein the deep trench location is outside of the deep N well.

7. The method of claim 1 further comprising:
   producing the integrated circuit with the integrated circuit design layout, wherein the integrated circuit design layout is free of the guard ring.

8. The method of claim 1 wherein calculating the deep trench location comprises calculating the deep trench location with a set deep trench width, wherein every deep trench location in the integrated circuit design layout has the set deep trench width.

9. The method of claim 8 wherein determining the guard ring width comprises determining the guard ring width wherein the guard ring width is less than the set deep trench width.

10. The method of claim 8 wherein:
    a double branch width is from between about 2 times the set deep trench width and about 2.5 times the set deep trench width.

11. The method of claim 10 wherein;
    forming the deep trench comprises forming the deep trench wherein a deep trench center branch length is greater than a deep trench end branch length, wherein the deep trench center branch is between two deep trench end branches, and wherein the two deep trench end branches are about parallel with the deep trench center branch.

12. The method of claim 8 wherein calculating the deep trench location comprises calculating the deep trench location wherein the set deep trench width is greater than the guard ring width.

13. The method of claim 8 wherein calculating the deep trench location comprises calculating the deep trench location wherein the set deep trench width is less than the guard ring width, and wherein the guard ring width varies within the integrated circuit design layout.

14. The method of claim 8 wherein calculating the deep trench location comprises calculating the deep trench location wherein at least a portion of the deep trench location is outside of a location of the guard ring.

15. The method of claim 1 wherein calculating the deep trench location comprises calculating the deep trench location with a set deep trench depth, wherein every deep trench location in the integrated circuit design layout has the set deep trench depth.

16. A method of producing an integrated circuit comprising:
    determining a guard ring width within an integrated circuit design layout, wherein a guard ring having the guard ring width surrounds an active area in the integrated circuit design layout;
    determining a guard ring location wherein the guard ring comprises a guard double ring, wherein each ring of the guard double ring surrounds one of a plurality of active areas;
    calculating a deep trench location for replacing the guard ring, wherein the deep trench location depends on the guard ring width, wherein calculating the deep trench location comprises calculating the deep trench location to form a triple ring having a center ring and two end rings, wherein one of the plurality of active areas is within each end ring and wherein the substrate within the center ring is free of active areas;
    replacing the guard ring in the integrated circuit design layout with a deep trench having the deep trench location; and
    forming the deep trench within a substrate at the deep trench location, wherein the deep trench surrounds the active area.

17. The method of claim 16 wherein:
    forming the deep trench comprises forming the deep trench wherein the center ring has a center ring length and the two end rings have an end ring length, and wherein the center ring length is greater than the end ring length.

18. The method of claim 16 wherein:
    calculating the deep trench location comprises calculating the deep trench location with a set deep trench width, wherein every deep trench location in the integrated circuit design layout has the set deep trench width; and wherein
    a guard center branch of the guard double ring has a guard center branch width that is about 3.5 times or more greater than the set deep trench width.

* * * * *